(12) United States Patent
Park et al.

(10) Patent No.: US 11,031,314 B2
(45) Date of Patent: Jun. 8, 2021

(54) SPACER STRUCTURE FOR DOUBLE-SIDED-COOLED POWER MODULE AND METHOD OF MANUFACTURING THE SAME

(71) Applicants: Hyundai Motor Company, Seoul (KR); Kia Motors Corporation, Seoul (KR)

(72) Inventors: Sung-Won Park, Incheon (KR); Hyeon-Uk Kim, Hwaseong-si (KR); Tae-Hwa Kim, Hwaseong-si (KR); Jun-Hee Park, Hwaseong-si (KR); Hyun-Koo Lee, Goyang-si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 57 days.

(21) Appl. No.: 16/695,987

(22) Filed: Nov. 26, 2019

(65) Prior Publication Data
US 2020/0357720 A1   Nov. 12, 2020

(30) Foreign Application Priority Data
May 9, 2019   (KR) .................. 10-2019-0054500

(51) Int. Cl.
| | |
|---|---|
| *H01L 23/34* | (2006.01) |
| *H01L 23/373* | (2006.01) |
| *H01L 23/367* | (2006.01) |
| *H01L 23/00* | (2006.01) |
| *H01L 21/48* | (2006.01) |

(52) U.S. Cl.
CPC ...... *H01L 23/3736* (2013.01); *H01L 21/4871* (2013.01); *H01L 23/3672* (2013.01); *H01L 24/27* (2013.01); *H01L 24/29* (2013.01); *H01L 2224/29147* (2013.01)

(58) Field of Classification Search
CPC ............ H01L 21/4871; H01L 23/3672; H01L 23/3736; H01L 24/27; H01L 24/29
USPC ........................................ 257/713
See application file for complete search history.

(56) References Cited

U.S. PATENT DOCUMENTS

| 7,535,092 B2 * | 5/2009 | Yokozuka | H01L 24/37 257/688 |
| 9,287,193 B2 * | 3/2016 | Orimoto | H01L 23/42 |
| 9,390,996 B2 * | 7/2016 | Jeon | H01L 23/051 |

\* cited by examiner

*Primary Examiner* — Luan C Thai
(74) *Attorney, Agent, or Firm* — Morgan, Lewis & Bockius LLP (57) ABSTRACT

A spacer structure, which connects an insulating substrate and a semiconductor chip of a double-sided-cooled power module, includes: a conductive material layer which is composed of a composite material; an underlying plating layer disposed on the conductive material layer; and a copper plating layer disposed on the underlying plating layer, in which the copper plating layer is in contact with a joining material that joins the spacer to the semiconductor chip and the insulating substrate.

10 Claims, 6 Drawing Sheets

FIG. 1

-PRIOR ART-

FIG. 2A

-PRIOR ART-

FIG. 2B

-PRIOR ART-

SPACER STRUCTURE FOR DOUBLE-SIDED-COOLED POWER MODULE AND METHOD OF MANUFACTURING THE SAME

CROSS-REFERENCE TO RELATED APPLICATION

This application claims priority under 35 U.S.C. § 119 to Korean Patent Application No. 10-2019-0054500, filed on May 9, 2019, in the Korean Intellectual Property Office, the disclosure of which is incorporated herein by reference in its entirety.

TECHNICAL FIELD

The present disclosure relates to a spacer structure for a double-sided-cooled power module and a method of manufacturing the same, and more particularly, to a spacer structure for electrically and physically connecting a semiconductor chip of a double-sided-cooled power module and an insulating substrate, and a method of manufacturing the same.

BACKGROUND

A power module, which appropriately transmits an electric current supplied from a high-voltage battery to a drive motor, is essentially used to operate the drive motor for an environmentally-friendly vehicle such as a hybrid vehicle or an electric vehicle.

The power module produces a large amount of heat because of a very fast switching operation thereof. Because the produced heat degrades efficiency of the power module, a cooler is installed to cool the power module.

A double-sided-cooled power module is configured such that substrates are installed at both sides of a semiconductor chip, that is, an Insulated-Gate Bipolar Transistor (IGBT) or a MOSFET of the power module, respectively, and coolers are installed outside the substrates, such that the power module is cooled simultaneously at both sides.

A double-sided-cooled power module in the related art has a structure in which a semiconductor chip and an insulating substrate are joined. In the structure of the double-sided-cooled power module, a component, which is called a spacer, is used to electrically and physically connect the semiconductor chip and the insulating substrate. The spacer is generally joined to the semiconductor chip and the insulating substrate by using a joining material (solder) in order to maintain a joining force between the semiconductor chip and the insulating substrate. In addition, the spacer is mainly made of a composite material such as CuMo or AlSiC. However, the composite material makes it difficult to ensure wettability with the joining material and does not cause an interface reaction with the joining material. For this reason, it is difficult to electrically and physically join the joining material and the spacer made of the composite material.

Accordingly, it is necessary to apply metal onto a surface of the spacer to join the spacer made of the composite material to the semiconductor chip and the insulating substrate by using the joining material. In general, nickel (Ni) is used as the metal to be applied onto the surface of the spacer made of the composite material.

In case of the double-sided-cooled power module, the semiconductor chip operates while being repeatedly turned on and off, and as a result, the semiconductor chip produces a large amount of heat while operating as described above. The durable life in this state in which heat is produced is evaluated by leaving the manufactured double-sided-cooled power module unattended in a high-temperature environment (e.g., at a temperature of about 120° C. to 175° C.) and checking for abnormality of a joint portion.

In a case in which a test is performed in a state in which the surface of the spacer made of the composite material is plated with nickel (Ni) and the double-sided-cooled power module is left unattended in the high-temperature environment, a thin metal layer applied onto the surface of the semiconductor chip reacts with the joining material due to the heat produced from the semiconductor chip, and as a result, an intermetallic compound is formed and grown. The thin metal layer on the surface of the semiconductor chip is completely exhausted due to the growth of the intermetallic compound, and as a result, there is a problem in that electrical characteristics of the semiconductor chip deteriorate or the semiconductor chip is burnt out.

Therefore, there is a need for a technology capable of improving electrical characteristics and durable life of the semiconductor chip by inhibiting the exhaustion of the thin metal layer on the surface of the semiconductor chip while using the spacer made of the composite material in the related art.

SUMMARY

The present disclosure has been made in an effort to provide a spacer structure and a method of manufacturing the same which are capable of improving electrical characteristics and durable life of a semiconductor chip of a double-sided-cooled power module by inhibiting exhaustion of a thin metal layer on a surface of the semiconductor chip while using a spacer composed of a composite material in the related art to electrically and physically connect the semiconductor chip and an insulating substrate.

Technical problems to be solved by the present disclosure are not limited to the above-mentioned technical problems, and other technical problems, which are not mentioned above, may be clearly understood from the following descriptions by those skilled in the art to which the present disclosure pertains.

An exemplary embodiment of the present disclosure provides a spacer structure which connects an insulating substrate and a semiconductor chip of a double-sided-cooled power module, the spacer structure including: a conductive material layer which is composed of a composite material; an undercoat layer disposed on the conductive material layer; and a copper plating layer disposed on the underlying plating layer, in which the copper plating layer is in contact with a joining material that joins the spacer to the semiconductor chip and the insulating substrate.

Another exemplary embodiment of the present disclosure provides a method of manufacturing a spacer which connects an insulating substrate and a semiconductor chip of a double-sided-cooled power module, the method including: applying an undercoat layer onto a conductive material layer composed of a composite material; and applying a copper plating layer onto the underlying plating layer, in which the copper plating layer is in contact with a joining material that joins the spacer to the semiconductor chip and the insulating substrate.

The underlying plating layer may be composed of one metal selected from a group consisting of nickel (Ni), titanium (Ti), chromium (Cr), and cobalt (Co).

The copper plating layer may have a thickness of 5 µm or more.

The spacer structure may further include a metal layer applied onto the copper plating layer, and the method of manufacturing the spacer may further include applying a metal layer onto the copper plating layer.

The metal layer may be composed of one metal selected from a group consisting of gold (Au), silver (Ag), and palladium (Pd).

The effects of the spacer structure and the method of manufacturing the same according to the present disclosure will be described below.

First, in case of a double-sided-cooled power module using a spacer structure in the related art, electrical characteristics of a semiconductor chip deteriorate because of a loss of a metal layer on a surface of the semiconductor chip when the double-sided-cooled power module is left unattended in a high-temperature environment. However, with the application of the spacer structure according to the present disclosure, it is possible to improve electrical characteristics and durable life of the semiconductor chip by inhibiting a loss of the metal layer on the surface of the semiconductor chip.

Second, according to the spacer structure according to the present disclosure, it is possible to improve wettability with the joining material by minimizing the nickel plating layer and adding the copper plating layer onto the nickel plating layer.

The effects obtained by the present disclosure are not limited to the aforementioned effects, and other effects, which are not mentioned above, will be clearly understood by those skilled in the art from the following description.

BRIEF DESCRIPTION OF THE DRAWINGS

The following accompanying drawings are provided to help understand the present disclosure, and exemplary embodiments of the present disclosure are provided together with the detailed description. However, technical features of the present disclosure are not limited to the particular drawings, and the features illustrated in the respective drawings may be combined to constitute another exemplary embodiment.

DETAILED DESCRIPTION OF THE EMBODIMENTS

Hereinafter, the present disclosure will be described in detail with reference to the accompanying drawings.

However, the present disclosure is not restricted or limited by exemplary embodiments. Like reference numerals indicated in the respective drawings refer to members which perform substantially the same functions.

An object and an effect of the present disclosure may be naturally understood or may become clearer from the following description, and the object and the effect of the present disclosure are not restricted only by the following description. In addition, in the description of the present disclosure, the specific descriptions of publicly known technologies related with the present disclosure will be omitted when it is determined that the specific descriptions may unnecessarily obscure the subject matter of the present disclosure.

Figure 1:
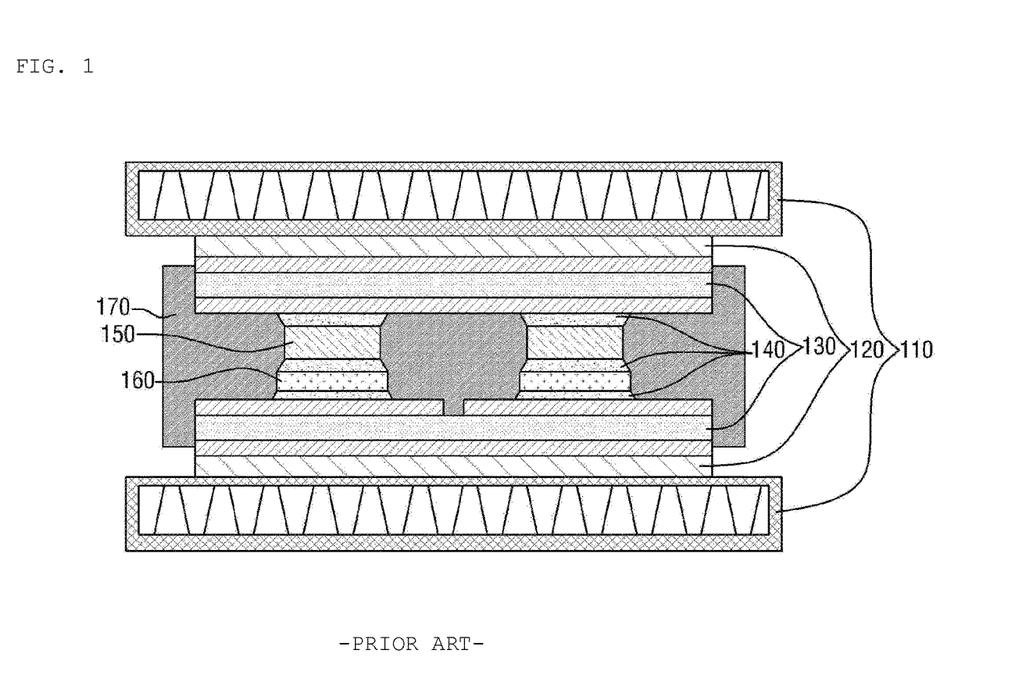
FIG. 1 is a cross-sectional view illustrating a structure of a double-sided-cooled power module in the related art.

FIG. 1 is a cross-sectional view illustrating a structure of a double-sided-cooled power module in the related art. As illustrated in FIG. 1, in the double-sided-cooled power module in the related art, upper and lower insulating substrates 130 may be disposed at both sides of a semiconductor chip 160, and a spacer 150 may be installed to connect the upper and lower substrates 130 and define a space in which a wire (not illustrated) is installed. In general, a joining process, using A joining material (solder) 140, is performed to maintain joining forces between the spacer 150, the semiconductor chip 160, and the insulating substrates 130. In addition, thermal grease, that is, a thermal interface material (TIM) 120 is formed outside each of the upper and lower insulating substrates 130 to transfer heat to coolers 110.

Figure 2A:
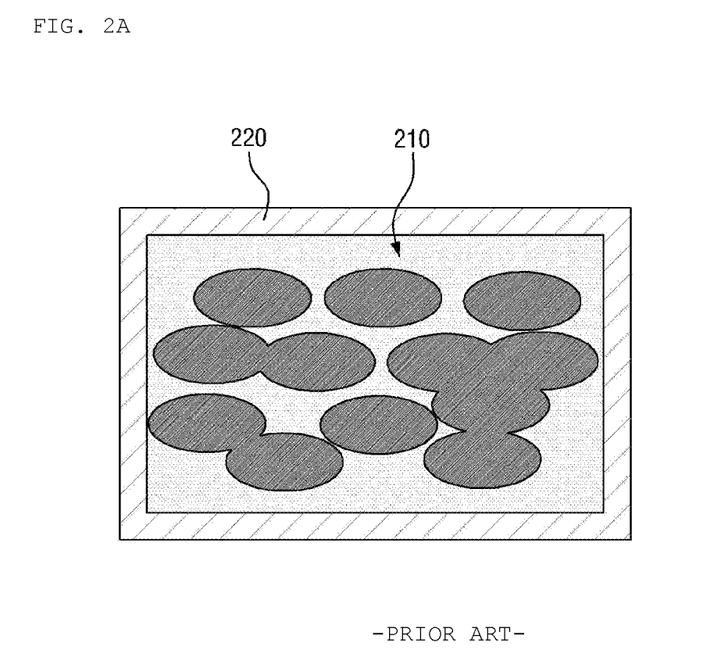
FIG. 2A is a view illustrating a spacer structure in the related art which is used for a double-sided-cooled power module.

FIG. 2A illustrates a spacer structure in the related art which is used for the double-sided-cooled power module. Referring to FIG. 2A, the spacer structure in the related art has a structure in which a nickel plating layer 220 is applied onto a conductive material layer 210 made of a composite material. There may occur the following problem when the spacer structure illustrated in FIG. 2A is used for the double-sided-cooled power module, and the problem will be described below with reference to FIG. 2B.

Figure 2B:
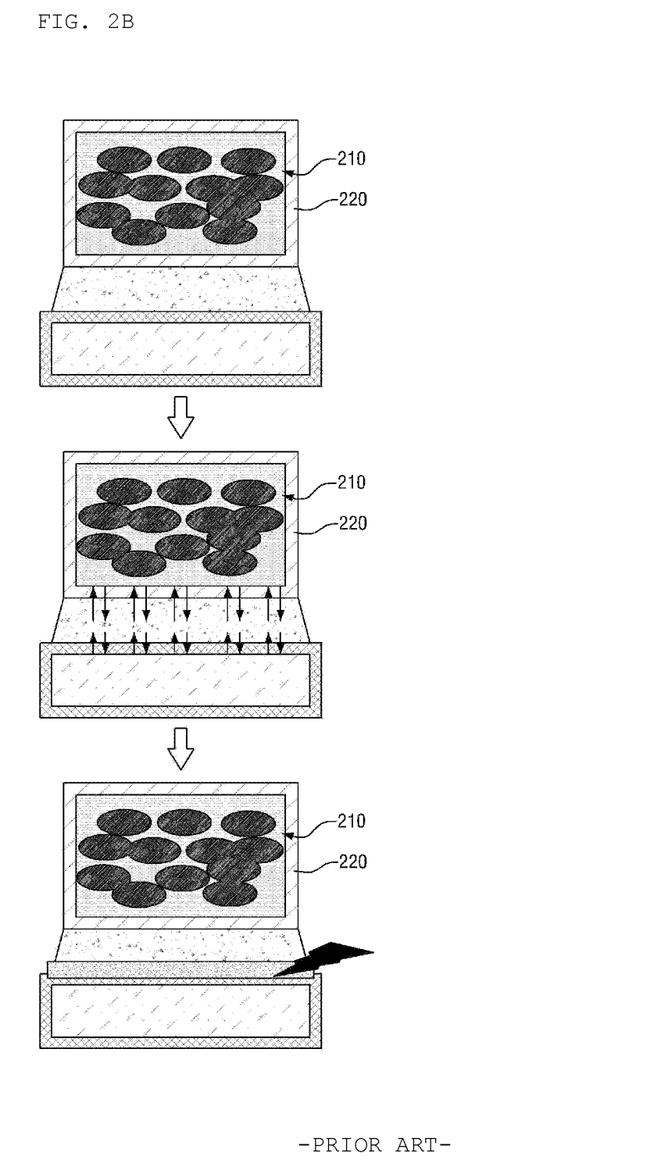
FIG. 2B is a schematic view illustrating a reaction process between a joining material and a metal layer at a joint portion between a semiconductor chip and a spacer in the related art illustrated in FIG. 2A.

FIG. 2B is a schematic view illustrating a reaction process between a joining material and a metal layer at a joint portion between the semiconductor chip and the spacer in the related art illustrated in FIG. 2A. As illustrated in FIG. 2B, in a case in which heat is produced from the semiconductor chip as the power module operates in a state in which the joining material is disposed between the spacer in the related art, in which the nickel plating layer 220 is applied onto the composite material layer 210, and the semiconductor chip on which a thin metal layer is applied, that is, in a case in which a high-temperature state (e.g., at a temperature of about 120° C. to 175° C.) is maintained, an intermetallic compound is formed as tin (Sn), which is a main component of the joining material, and the metal layer on the surface of the semiconductor chip react with each other and intermetallic diffusion occurs.

In this regard, because the metal layer applied onto the surface of the semiconductor chip is configured as a thin film, the metal layer may be easily exhausted in the case in which the high-temperature state is maintained as described above. According to an exemplary embodiment of the present disclosure, the thin metal layer on the semiconductor chip may include a nickel layer of several micrometers (μm) and a precious metal layer made of gold (Au) or the like and having a level of nanometer (nm). When the joining material is melted in the high-temperature state, the precious metal layer completely disappears into the joining material, and thereafter, the nickel layer serves as a main reaction layer that reacts with the joining material.

Consequently, the intermetallic compound is formed as the thin metal layer on the surface of the semiconductor chip reacts with the joining material due to the heat produced from the semiconductor chip, and the metal layer on the surface of the semiconductor chip is completely exhausted, which causes a problem of a deterioration in electrical characteristics and durability of the semiconductor chip.

Figure 3A:
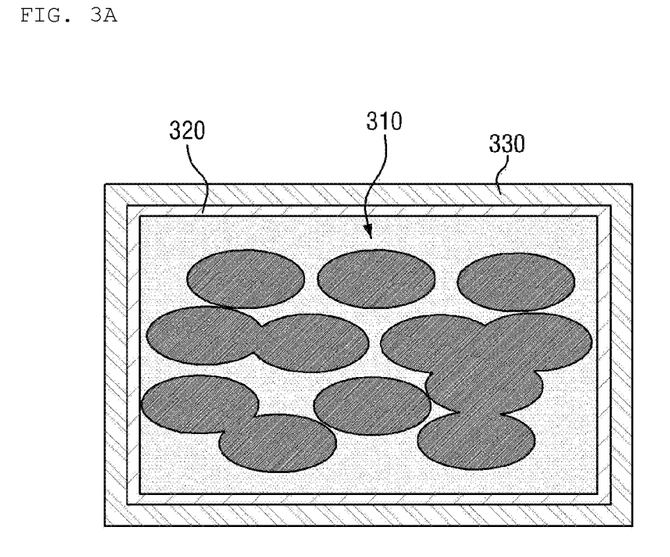
FIG. 3A is a view illustrating a spacer structure according to an exemplary embodiment of the present disclosure which may be used for a double-sided-cooled power module.

As a solution for this problem, a spacer structure according to an exemplary embodiment of the present disclosure, on which underlying plating is performed and then copper plating is additionally performed, is proposed, as illustrated in FIG. 3A. The underlying plating is performed to ensure a close-contact force between the spacer and the copper plating layer, and the joining material reacts with a copper plating layer instead of an underlying plating layer.

The spacer structure according to an exemplary embodiment of the present disclosure illustrated in FIG. 3A will be more specifically described below.

The spacer according to an exemplary embodiment of the present disclosure is a component configured to connect the insulating substrate and the semiconductor chip of the double-sided-cooled power module. A cross-sectional structure of the spacer will be described with reference to FIG. 3A. The spacer includes a conductive material layer 310 made of a composite material, an underlying plating layer 320 applied onto the conductive material layer 310, and a copper plating layer 330 applied onto the underlying plating layer 320. The copper plating layer 330, which is disposed at an outermost peripheral portion of the cross-sectional structure of the spacer, is in contact with the joining material configured to join the spacer to the semiconductor chip and the insulating substrate.

In particular, the conductive material layer 310 of the spacer may be made of an electrically conductive material that enables an electric current to flow therethrough, that is, a material having excellent thermal conductivity. In addition, according to an exemplary embodiment of the present disclosure, the underlying plating layer 320 may be made of metal to ensure the close-contact force between the conductive material layer 310 and the copper plating layer 330. For example, the underlying plating layer 320 may be made of any one of nickel (Ni), titanium (Ti), chromium (Cr), and cobalt (Co).

In particular, the copper plating layer 330 may have a thickness of 5 μm or more. In addition, according to an exemplary embodiment of the present disclosure, an outer periphery of the copper plating layer 330 may be plated with an additional metal layer to prevent oxidation and improve wettability with the joining material. For example, the outer periphery of the copper plating layer 330 may be additionally plated with a metal layer made of any one of gold (Au), silver (Ag), and palladium (Pd).

According to the spacer structure according to an exemplary embodiment of the present disclosure illustrated in FIG. 3A, it is possible to solve the problem of the deterioration in electrical characteristics and durable life of the semiconductor chip which occurs on the spacer structure in the related art as described above with reference to FIGS. 2A and 2B. This configuration will be described below with reference to FIG. 3B.

Figure 3B:
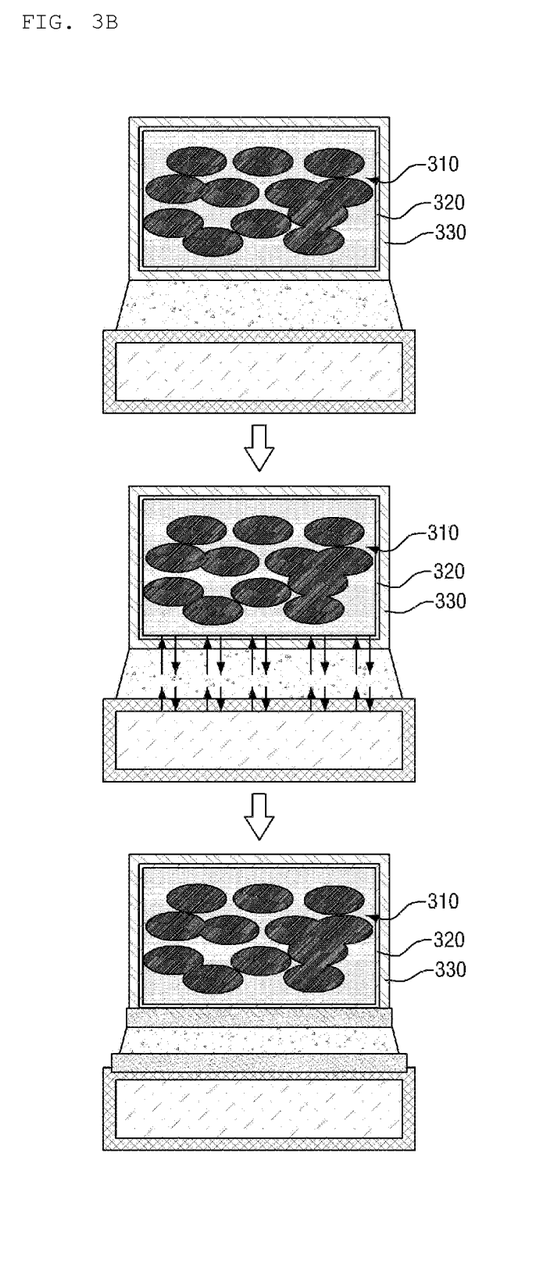
FIG. 3B is a schematic view illustrating a reaction process between a joining material and a metal layer at a joint portion between a semiconductor chip and a spacer according to an exemplary embodiment of the present disclosure illustrated in FIG. 3A.

FIG. 3B is a schematic view illustrating a reaction process between the joining material and the metal layer at the joint portion between the semiconductor chip and the spacer structure according to an exemplary embodiment of the present disclosure. As illustrated in FIG. 3B, in the case in which heat is produced from the semiconductor chip as the power module operates in the state in which the joining material is disposed between the spacer according to an exemplary embodiment of the present disclosure, in which the underlying plating layer 320 and the copper plating layer 330 are applied onto the conductive material layer 310, and the semiconductor chip on which the thin metal layer is applied, that is, in the case in which a high-temperature state (e.g., at a temperature of about 120° C. to 175° C.) is maintained, tin (Sn), which is a main component of the joining material, reacts not only with the metal layer (e.g., the nickel plating layer) on the surface of the semiconductor chip but also with the copper plating layer 330 of the spacer. Therefore, an intermetallic compound is formed as intermetallic diffusion occurs between the joining material and the semiconductor chip and between the joining material and the spacer.

However, unlike the case in which the metal layer on the semiconductor chip is exhausted as the intermetallic compound is formed between the joining material and the metal layer on the surface of the semiconductor chip as described above with reference to FIG. 2B in which the spacer (illustrated in FIG. 2A) in the related art is used, a reaction speed between the joining material and the copper plating layer of the spacer is significantly higher than a reaction speed between the joining material and the thin metal layer (e.g., the nickel plating layer) of the semiconductor chip in the case of FIG. 3B in which the spacer (illustrated in FIG. 3A) according to an exemplary embodiment of the present disclosure is used, such that the copper plating layer of the spacer preferentially reacts with the joining material, as a result, the reaction between the joining material and the thin metal layer of the semiconductor chip is inhibited. The reaction speed, which is inhibited as described above, also inhibits the exhaustion of the thin metal layer of the semiconductor chip. That is, the thin metal layer of the semiconductor chip is not completely exhausted even though a reaction layer is formed between the joining material and the thin metal layer of the semiconductor chip. Consequently, since the exhaustion of the thin metal layer of the semiconductor chip is inhibited, it is possible to solve the problem of the deterioration in electrical characteristics of the semiconductor chip in the high-temperature environment.

Figure 4:
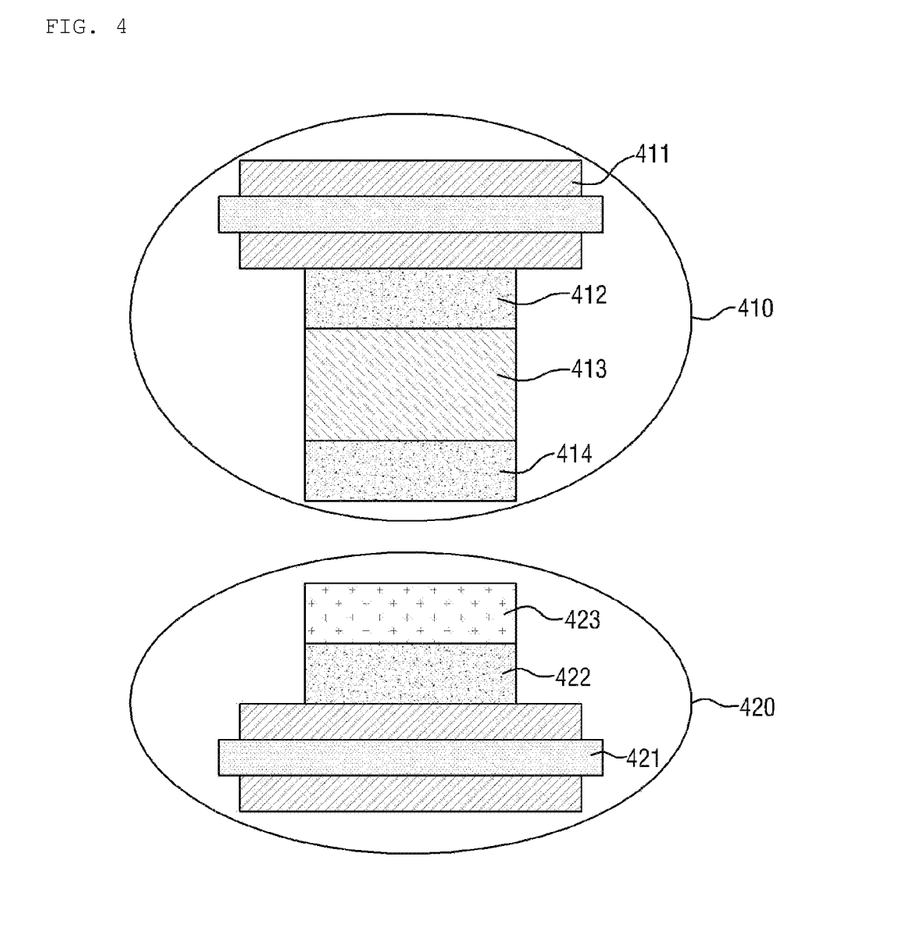
FIG. 4 is a schematic view illustrating a method of joining the double-sided-cooled power module according to an exemplary embodiment of the present disclosure.

FIG. 4 is a schematic view illustrating a method of joining the double-sided-cooled power module according to an exemplary embodiment of the present disclosure. The joining method will be specifically described below.

Referring to FIG. 4, the joining of the double-sided-cooled power module according to an exemplary embodiment of the present disclosure may be performed through the following processes.

First, a first half-finished product 420 is formed by coupling a lower insulating substrate 421 to a jig, disposing a first joining material 422 and a semiconductor chip 423 on the lower insulating substrate 421, and then performing soldering. Thereafter, a second half-finished product 410 is formed by coupling an upper insulating substrate 411 to a jig, disposing a second joining material 412 and a spacer 413 on the upper insulating substrate 411, additionally disposing a third joining material 414 on the spacer 413, and then performing soldering. In this case, the spacer 413 may be a subsidiary material made by performing the underlying plating and the copper plating on the composite material according to an exemplary embodiment of the present disclosure. Finally, the first half-finished product 420 and the second half-finished product 410 are coupled to the jigs, respectively, and then soldering is performed.

Referring to FIG. 4, the joining of the double-sided-cooled power module according to another exemplary embodiment of the present disclosure may be performed through the following processes.

First, the first half-finished product 420 is formed by coupling the lower insulating substrate 421 to the jig, disposing the first joining material 422 and the semiconductor chip 423 on the lower insulating substrate 421, and then performing soldering. Thereafter, the second half-finished product 410 is formed by coupling the upper insulating substrate 411 to the jig, and disposing the second joining material 412 and the spacer 413 on the upper insulating substrate 411. In this case, the spacer 413 may be a subsidiary material made by performing the underlying plating and the copper plating on the composite material according to an exemplary embodiment of the present disclosure. Finally, the first half-finished product 420 and the second half-finished product 410 are coupled to the jigs, respectively, the third joining material 414 is inserted therebetween, and then soldering is performed.

When comparing several samples made by joining the power modules in accordance with any one of the above-mentioned methods with an ideal state, changes in electrical characteristics are shown in the following Tables 1 and 2.

Table 1 shows changes in electrical characteristics of the respective samples in the case in which the spacer in the related art illustrated in FIG. 4 is joined, and Table 2 shows changes in electrical characteristics of the respective samples in the case in which the spacer according to an exemplary embodiment of the present disclosure illustrated in FIG. 4 is joined.

TABLE 1

|              | Sample 1 | Sample 2 |
|--------------|----------|----------|
| Vce(sat)-H[V]| 7.5%↑    | 13%↓     |
| Vce(sat)-L[V]| 25%↑     | 15%↓     |
| Vf-H[V]      | 32%↑     | 20%↑     |
| Vf-L[V]      | 9%↑      | 34%↑     |

TABLE 2

|              | Sample 1 | Sample 2 | Sample 3 | Sample 4 | Sample 5 |
|--------------|----------|----------|----------|----------|----------|
| Vce(sat)-H[V]| 2.15%↑   | 2.46%↑   | 2.08%↑   | 1.85%↑   | 2.15%↑   |
| Vce(sat)-L[V]| 1.00%↑   | 0.69%↓   | 0.92%↑   | 1.00%↑   | 0.15%↓   |
| Vf-H[V]      | 2.35%↑   | 2.35%↑   | 1.35%↑   | 1.65%↑   | 2.71%↑   |
| Vf-L[V]      | 1.82%↓   | 2.18%↓   | 2.65%↓   | 2.41%↓   | 1.59%↓   |

When comparing Tables 1 and 2, it can be ascertained that the electrical characteristics are changed between 7.5% and 34% in the case in which the spacer in the related art is used, whereas the electrical characteristics are changed between 0.15% and 2.71% in the case in which the spacer according to an exemplary embodiment of the present disclosure is used. It can be ascertained that a change in electrical characteristics is inhibited in the case in which the spacer structure according to an exemplary embodiment of the present disclosure is used as described above, in comparison with the case in which the spacer structure in the related art is used. In other words, in the case in which the spacer structure according to an exemplary embodiment of the present disclosure is used, it is possible to solve the problem in the related art in that electrical characteristics of the semiconductor chip deteriorate or the semiconductor chip is burnt out.

In addition, Table 3 shows thicknesses of the remaining metal layers on the surfaces of the semiconductor chips which are compared between the case in which the spacer structure according to an exemplary embodiment of the present disclosure is used after soldering the power module in accordance with any one of the methods described with reference to FIG. 4 and the case in which the spacer structure in the related art is used.

TABLE 3

|                                                        | Related Art | Present Disclosure |
|--------------------------------------------------------|-------------|--------------------|
| Thickness of remaining chip metal layer after soldering| 1.1 μm      | 1.5 μm             |

As shown in Table 3, when the power module operates (i.e., the high-temperature state is maintained), the thickness of the remaining metal layer on the surface of the semiconductor chip is greater by approximately 0.4 μm in the case in which the spacer structure according to an exemplary embodiment of the present disclosure is used (about 1.5 μm) than in the case in which the spacer structure in the related art is used (about 1.1 μm). It can be ascertained that a loss of the metal layer on the surface of the semiconductor chip is inhibited in the case in which the spacer structure according to an exemplary embodiment of the present disclosure is used, in comparison with the case in which the spacer structure in the related art is used. In other words, in the case in which the spacer structure according to an exemplary embodiment of the present disclosure is used, the exhaustion of the metal layer on the semiconductor chip is inhibited, and as a result, it is possible to solve the problem of a reduction in durable life of the semiconductor chip in the related art.

While the present disclosure has been described in detail above with reference to the exemplary embodiments, those skilled in the art to which the present disclosure pertains will understand that the exemplary embodiment may be variously modified without departing from the scope of the present disclosure. Accordingly, the scope of the present disclosure should not be limited to the described exemplary embodiment, but should be defined not only by the appended claims but also by all changes or modified forms derived from an equivalent concept to the claims.

What is claimed is:

1. A spacer structure which connects an insulating substrate and a semiconductor chip of a double-sided-cooled power module, the spacer structure comprising:
   a conductive material layer composed of a composite material;
   an underlying plating layer disposed on the conductive material layer; and
   a copper plating layer disposed on the underlying plating layer,
   wherein the copper plating layer is in contact with a joining material that joins the spacer to the semiconductor chip and the insulating substrate.

2. The spacer structure of claim 1, wherein the underlying plating layer is composed of one metal selected from a group consisting of nickel (Ni), titanium (Ti), chromium (Cr), and cobalt (Co).

3. The spacer structure of claim 1, wherein the copper plating layer has a thickness of 5 μm or more.

4. The spacer structure of claim 1, further comprising a metal layer disposed on the copper plating layer.

5. The spacer structure of claim 4, wherein the metal layer is composed of one metal selected from a group consisting of gold (Au), silver (Ag), and palladium (Pd).

6. A method of manufacturing a spacer which connects an insulating substrate and a semiconductor chip of a double-sided-cooled power module, the method comprising:
- applying an underlying plating layer onto a conductive material layer composed of a composite material; and
- applying a copper plating layer onto the underlying plating layer,
- wherein the copper plating layer is in contact with a joining material that joins the spacer to the semiconductor chip and the insulating substrate.

7. The method of claim 6, wherein the underlying plating layer is composed of one metal selected from a group consisting of nickel (Ni), titanium (Ti), chromium (Cr), and cobalt (Co).

8. The method of claim 6, wherein the copper plating layer has a thickness of 5 µm or more.

9. The method of claim 6, further comprising applying a metal layer onto the copper plating layer.

10. The method of claim 9, wherein the metal layer is composed of one metal selected from a group consisting of gold (Au), silver (Ag), and palladium (Pd).

* * * * *